United States Patent
Nishikawa et al.

(10) Patent No.: US 8,409,897 B2
(45) Date of Patent: Apr. 2, 2013

(54) PRODUCTION METHOD OF RED LIGHT EMITTING SEMICONDUCTOR DEVICE

(75) Inventors: Atsushi Nishikawa, Suita (JP); Yasufumi Fujiwara, Suita (JP); Yoshikazu Terai, Suita (JP); Takashi Kawasaki, Suita (JP); Naoki Furukawa, Suita (JP)

(73) Assignee: Osaka University, Osaka (JP)

( * ) Notice: Subject to any disclaimer, the term of this patent is extended or adjusted under 35 U.S.C. 154(b) by 0 days.

(21) Appl. No.: 13/318,623

(22) PCT Filed: Apr. 28, 2010

(86) PCT No.: PCT/JP2010/057599
§ 371 (c)(1),
(2), (4) Date: Nov. 3, 2011

(87) PCT Pub. No.: WO2010/128643
PCT Pub. Date: Nov. 11, 2010

(65) Prior Publication Data
US 2012/0077299 A1    Mar. 29, 2012

(30) Foreign Application Priority Data
May 7, 2009 (JP) ................................. 2009-112535

(51) Int. Cl.
*H01L 33/30* (2010.01)
(52) U.S. Cl. ........ 438/46; 438/22; 438/48; 438/E33.008
(58) Field of Classification Search ............ 438/22, 438/46–48, 384, 393, 791; 257/101–103, 257/76, 79, 81, 97–98
See application file for complete search history.

(56) References Cited

FOREIGN PATENT DOCUMENTS

| JP | 11-87778 A | 3/1999 |
|---|---|---|
| JP | 2000-91703 A | 3/2000 |
| JP | 2002-208730 A | 7/2002 |
| JP | 2004-288757 A | 10/2004 |
| JP | 2005-340231 A | 12/2005 |
| JP | 2005-353651 A | 12/2005 |
| JP | 2008-60375 A | 3/2008 |

OTHER PUBLICATIONS

Heikenfeld et al., "Red light emission by photoluminescence and electroluminescence from Eu-doped GaN", Applied Physics Letters, vol. 75, No. 9, pp. 1189-1191, Aug. 30, 1999.
International Preliminary Report on Patentability, dated Mar. 31, 2011, for Application No. PCT/JP2010/057599.

(Continued)

*Primary Examiner* — Dung A. Le
(74) *Attorney, Agent, or Firm* — Birch Stewart Kolasch & Birch, LLP

(57) ABSTRACT

Disclosed are: an environmentally friendly red light-emitting semiconductor element which operates at low voltage, while having sufficient luminous efficiency and sufficient luminous intensity; and a method for manufacturing the same. Specifically disclosed is a method for manufacturing a red light-emitting semiconductor element, wherein an active layer is formed between a p-type layer and an n-type layer in a sequence of the formation steps of the p-type layer and the n-type layer, said active layer being obtained by adding Eu or Pr into GaN, InN, AlN or a mixed crystal thereof by substituting Ga, In or Al with Eu or Pr, using an organic metal vapor phase deposition method under specific temperature conditions in a site wherein light having a wavelength of 618-623 nm can be emitted. Also specifically disclosed is a red light-emitting semiconductor element which is manufactured by the method for manufacturing a red light-emitting semiconductor element.

4 Claims, 11 Drawing Sheets

OTHER PUBLICATIONS

Kawasaki et al., "Effect of growth temperature on Eu-doped GaN layers grown by organometallic vapor phase epitaxy", Phys. Status Solidi C, pp. 1-3, 2010 (Published online Apr. 21, 2010).

Laski et al., "Study of GaN:Eu3+ Thin Films Deposited by Metallorganic Vapor-Phase Epitaxy", Journal of the Electrochemical Society, vol. 155, No. 11, pp. J315-J320, Sep. 22, 2008.

Morishima et al., "Growth of Eu Doped GaN and Electroluminescence from MIS Structure", Phys. Stat. Sol. (A), vol. 176, pp. 113-117, 1999.

Nishikawa et al., "Room-Temperature Red Emission from a p-Type/Europium-Doped/n-Type Gallium Nitride Light-Emitting Diode under Current Injection", Applied Physics Express, vol. 2, pp. 071004-1 to 017004-3, 2009 (Published online Jun. 26, 2009).

Pan et al., "Red emission from Eu-doped GaN luminescent films grown by metalorganic chemical vapor deposition", Applied Physics Letters, vol. 83, No. 1, pp. 9-11, Jul. 7, 2003.

Sawahata et al., "TEM observation of Eu-doped GaN and fabrication of n-GaN/Eu:GaN/p-GaN structure", Optical Materials, vol. 28, pp. 759-762, 2006 (Published online Nov. 3, 2005).

PRODUCTION METHOD OF RED LIGHT EMITTING SEMICONDUCTOR DEVICE

TECHNICAL FIELD

The present invention relates to a red light emitting semiconductor device and a production method thereof. More particularly, it relates to a red light emitting semiconductor device showing high luminous efficiency by application of low voltage, wherein an active layer obtained by adding Eu or Pr to a specific base material such as GaN, InN, AlN and the like is disposed between an n-type layer and a p-type layer, and a production method thereof.

BACKGROUND ART

Presently, as a red light emitting semiconductor device (red semiconductor light emitting device, or semiconductor device, light emitting diode, LED), widely used is a semiconductor device having an AlGaInP layer provided as a light emitting layer on a GaAs substrate.

However, since this red light emitting semiconductor device contains harmful elements such as As and P, environmentally-friendly red light emitting semiconductor devices not containing these harmful elements are eagerly desired because of recent enhancement of environmental awareness.

For this reason, there are investigations for manufacturing a red light emitting semiconductor device using a nitride semiconductor, which is known as a semiconductor material for a blue light emitting semiconductor device.

As an example thereof, there is an investigation of obtaining a red light emitting semiconductor device using a semiconductor obtained by adding high concentration In to GaN. However, when the In content becomes higher, the piezoelectric field effect ascribable to strain of a crystal becomes more remarkable and the luminous efficiency as a red light emitting semiconductor device becomes lower. Thus, such a technology is not realized under the present conditions.

Under such a state, paying attention to wide gap of a nitride semiconductor, use of a semiconductor obtained by adding (doping) Eu to a base material GaN as a red light emitting semiconductor device material is investigated and attracting attention (Patent Document 3, Non-patent Documents 1-5). However, the resultant semiconductor has poor crystal quality. Further, high voltage of tens to hundreds of V is necessary for light emission. Thus, it is problematic to adopt such a semiconductor as a red light emitting semiconductor device material.

Further, there is also an investigation of fabricating a fluorescent substance layer obtained by adding Eu to a GaInN-based semiconductor and causing red light emission from this fluorescent substance layer. However, there is a problem that luminous efficiency is not sufficient since it is an indirect light emission mechanism in which red light emission is caused by excitation of the fluorescent substance layer by blue light emission (Patent Documents 1, 2, 4, 5).

PRIOR ART REFERENCE

Patent Document
Patent Document 1: JP 2002-208730 A
Patent Document 2: JP 11-87778 A
Patent Document 3: JP 2000-91703 A
Patent Document 4: JP 2005-340231 A
Patent Document 5: JP 2005-353651 A Non-Patent Document
Non-patent document 1: J. Sawahata and other fours, "TEM observation of Eu-doped GaN and fabrication of n-GaN/Eu:GaN/p-GaN structure", Optical Materials 28 (2006) 759-762, ELSEVIER
Non-patent document 2: J. Heikenfeldand and other fours, "Red light emission by photoluminescence and electroluminescence from Eu-doped GaN", APPLIED PHYSICS LETTERS VOLUME 75, NUMBER 9, 30 Aug. 1999, American Institute of Physics
Non-patent document 3: S. Morishimaand and other fours, "Growth of Eu Doped GaN and Electroluminescence from MIS Structure", phys. stat. sol. (a) 176, 113 (1999)
Non-patent document 4: M. Panand and other one, "Red emission from Eu-doped GaN luminescent films grown by metalorganic chemical vapor deposition", APPLIED PHYSICS LETTERS VOLUME 83, NUMBER 1, 7 Jul. 2003, American Institute of Physics
Non-patent document 5: J. Laskiand and other sixes, "Study of GaN:$Eu^{3+}$ Thin Films Deposited by Metallorganic Vapor-Phase Epitaxy", Journal of The Electrochemical Society, 155(11)J315-J320 (2008)

SUMMARY OF THE INVENTION

Problem to be solved by the Invention

In view of the above-described problem, an object of the present invention is to provide a red light emitting semiconductor device which is capable of operating at low voltage, has sufficient luminous efficiency, and, further, is friendly to environments, and a production method thereof.

Means for solving the Problem

The present inventors have intensively studied, and resultantly found that the above-described problem can be solved by inventions of the following claims, leading to completion of the present invention.

The invention is a production method of a red light emitting semiconductor device using GaN, InN, AlN or a mixed crystal composed of any two or more of them, wherein an active layer obtained by adding Eu or Pr to GaN, InN, AlN or a mixed crystal composed of any two or more of them so as to substitute Ga, In or Al using an organometallic vapor phase epitaxy method under a temperature condition of 900 to 1100° C. is formed between a p-type layer and an n-type layer in a series of formation steps including formation of the p-type layer and the n-type layer.

The invention is also a production method of a red light emitting semiconductor device using GaN, InN, AlN or a mixed crystal composed of any two or more of them, wherein an active layer obtained by adding Eu or Pr to GaN, InN, AlN or a mixed crystal composed of any two or more of them so as to substitute Ga, In or Al using an organometallic vapor phase epitaxy method under a temperature condition of 900 to 1100° C. at a site wherein light emission of a wavelength of 618 to 623 nm is possible is formed between a p-type layer and an n-type layer in a series of formation steps including formation of the p-type layer and the n-type layer.

The present inventors have first investigated causes for the problems of the above-described conventional red light emitting semiconductor device using a semiconductor obtained by adding Eu to GaN or GaInN recently attracting attention, and obtained the following investigation results.

(1) Conventional Eu addition is, mainly, carried out by ion implantation with high energy using an ion implantation method. Because of this, the surface of a semiconductor and a crystal around this are damaged, and excellent pn junction for a red light emitting semiconductor device cannot be formed. Thus, it is not suitable for use in a device structure.

(2) Eu is added also by a molecular beam epitaxy method, however, a p-type layer of good quality cannot be fabricated. That is, the light emission mechanism in a red light emitting semiconductor device obtained by adding Eu to GaN and the like is an excitation mechanism of manifesting light emission by excitation of Eu ions by allowing accelerated carriers to collide with Eu, and high voltage of tens to hundreds of V is needed for energy for sufficient acceleration of carriers.

(3) When Eu in an active layer is disposed as a substitution of Ga, sufficient light emission is manifested. However, when it is disposed in the form of invasion between lattices, luminous efficiency attenuates remarkably, thus, precise control of Eu is required.

Specifically, by controlling the Eu ion substitution site to be a Ga site or its extremely near position, peaks around 621 nm revealing light emission ascribable to Eu ions become dominant in its photoluminescence spectrum (PL spectrum), and sufficient light emission can be performed to obtain high-luminance light emission.

Based on these findings, the present inventors have intensively investigated and resultantly found that if an active layer obtained by adding Eu to a base material GaN so as to substituting for Ga using an organometallic vapor phase epitaxy method (OMVPE, MOCVD) under given conditions is formed between a p-type layer and an n-type layer, light emission in which peaks around 621 nm are dominant becomes possible, and a red light emitting semiconductor device which can be operated at low voltage and showing high luminous efficiency is obtained.

According to the present invention, good pn junction can be formed without causing damage to the surface of a semiconductor and crystals around this, unlike an ion implantation method and a molecular beam epitaxy method, since addition of Eu is controlled by using an organometallic vapor phase epitaxy method under certain conditions in forming an active layer.

The red light emitting semiconductor device having such good pn junction is capable of implanting holes from a p-type layer and electrons from an n-type layer into an active layer through an ohmic electrode by application low voltage of around several V unlike light emission by the above-described collisional excitation mechanism. Energy of thus implanted holes and electrons excites Eu ions, and energy discharged when the exited Eu ions return to the ground state causes red light emission.

As described above, according to the present invention, the consumed power can be decreased remarkably in a red light emitting semiconductor device, and the device life can be improved remarkably.

Further, according to the present invention, since Eu is added under control so that the Eu ion substitution site is a Ga site and or its extremely near position under a given growth temperature, red light emission in which peaks around 621 nm are dominant becomes possible and sufficient luminous efficiency can be obtained. Since this light emission is not indirect light emission via a fluorescent substance layer but direct light emission, luminous efficiency is high.

"Peaks around 621 nm are dominant" means that peaks around 621 nm are increased as much as possible since light emission at a wavelength in the range of 618 to 623 nm centering on 621 nm is light emission ascribable to Eu ions.

In the above descriptions, the present invention has been explained using GaN as the base material and Eu as the addition element. However, the base material is not limited to GaN, and the same effect as described above can be obtained even if InN, AlN or a mixed crystal thereof (InGaN, AlGaN and the like) is used as the base material. Further, the addition element is not limited to Eu, and the same effect as described above can be obtained even if Pr is used as the addition element.

Eu or Pr is used as the addition element, since in these elements, outer shell electrons are shielded by inner shell electrons, light emission caused by inner shell transition shows a wavelength of 590 nm or more, which is not limited to the NTSC color gamut and the HDTV color gamut and is a reddish light.

For obtaining the excellent performance as described above, the temperature condition in an organometallic vapor phase epitaxy method used for formation of an active layer is important, and it is important to form an active layer under a condition of 900 to 1100° C.

When the temperature is lower than 900° C., Eu ions having a different crystal field increase and peaks at 621 nm decrease remarkably, while when over 1100° C., Eu ions are desorbed from the surface and Eu addition becomes difficult. The preferable temperature condition is from 950 to 1050° C.

Further, for obtaining good pn junction as described above, it is important to form a p-type layer, an active layer and an n-type layer in a series of formation steps.

That is, in formation of a p-type layer, and active layer and an n-type layer, if a p-type layer, an active layer and an n-type layer are formed sequentially (the order of p-type layer and n-type layer is not a problem) in a reaction vessel without removing from the reaction vessel halfway, an interface state does not exist between layers, carriers can be implanted efficiently, and operation at low voltage becomes possible.

From the above-described standpoint, it is also preferable to form an n-type layer and a p-type layer by an organometallic vapor phase epitaxy method, however, other growth methods are not excluded.

In the present invention, luminous efficiency does not lower by the piezo-electric field effect, since the In concentration is not enhanced.

Since the present invention needs no harmful elements such as As and P, the resultant red light emitting semiconductor device is friendly to environments, though the present invention does not exclude use of a substrate containing As, P and the like such as GaAs, GaP and the like, as the substrate.

Since the red light emitting semiconductor device in the present invention has basically the same structure as that of a conventional nitride blue light emitting semiconductor device, the existing production equipment for a nitride blue light emitting semiconductor device can be used only by changing the addition material, in producing the device, and its cost can be reduced.

Further, since blue and green light emitting semiconductor devices are already obtained as the nitride light emitting semiconductor device, these light emitting semiconductor devices and the red light emitting semiconductor device of the present invention can be integrated as a light emitting diode of light three primary colors of "red•green•blue", and it is made possible to produce a full-color display using a high-definition light emitting diode showing low consumed power.

It is preferable that the band gap of layers sandwiching an active layer is larger than the band gap of the active layer. By this, holes and electrons implanted into an active layer can be confined effectively in the active layer, and a red light emitting semiconductor device having a better light emitting property can be obtained. Specifically, it is preferable to provide an active layer between InGaN/GaN, GaN/AlGaN and the like.

A principal point of the present invention capable of obtaining a red light emitting semiconductor device having the excellent performance as described above is adoption of an organometallic vapor phase epitaxy method under a given high temperature condition as described above. Conventionally, rare earth elements have been considered to be difficult to be added since even if absorbed on the surface of a substrate at high temperature, the elements are desorbed by thermal energy.

A red light emitting semiconductor device operable at low voltage using an organometallic vapor phase epitaxy method has not been developed in a long period until now, and the reason for this is considered to be the above-described preconceived idea and no sufficient attention to important conditions in manufacturing a device.

The present inventors have succeeded in manufacturing of a red light emitting semiconductor device having the above-described excellent feature, by adding Eu or Pr while optimizing growth conditions using a high temperature organometallic vapor phase epitaxy method for overcoming the problem of crystal damage by an ion implantation method and a molecular beam epitaxy method, regardless of the conventional idea.

The invention is drawn to the production method of a red light emitting semiconductor device described above, wherein the above-described element to be added is Eu.

Eu is preferable as the element to be added since it shows high red luminous efficiency as compared with Pr. In fact, Eu was used as a red fluorescent substance for a color television, and Eu compounds are easily available as compared with Pr, thus, Eu is preferable as the element to be added.

The invention is the production method of a red light emitting semiconductor device described above, wherein the flow rate of a carrier gas in the above-described organometallic vapor phase epitaxy method used for forming the above-described active layer is 10 to 40 SLM.

It has been found that when the flow rate of a carrier gas is 10 to 40 SLM, even if the pressure in growing an active layer (GaN layer) is increased, sufficient flow rate can be secured and Eu addition can be carried out, thus, stable high-luminance light emission can be obtained by securing sufficient Eu concentration.

The invention is the production method of a red light emitting semiconductor device described above, wherein the growth pressure in the above-described the organometallic vapor phase epitaxy method used for forming the above-described active layer is over 5 kPa and less than 105 kPa.

For efficiently adding the element to a base material in substitution mode using an organometallic vapor phase epitaxy method, it is necessary to control thermal convection of a raw material gas in a reaction apparatus. It has been found that when the growth pressure is controlled to be over 5 kPa and less than 105 kPa, thermal convection on the surface of a base material is controlled, uniform addition is performed, and a stable active layer can be epitaxially grown, thus, crystal surface flatness can be secured.

That is, when the growth pressure is less than 5 kPa, the crystallinity of a base material GaN deteriorates, and crystal surface flatness is lost. In contrast, when 105 kPa or more, it is difficult to keep the flow velocity constant in growing a crystal, the ununiformity of the Eu concentration increases, and crystal surface flatness cannot be secured.

When crystal surface flatness is lost, an excellent interface cannot be formed in manufacturing a pn junction diode structure, and device performance is lost. A pressure of 10 to 100 kPa is more preferable.

When GaN growth under atmospheric pressure (100 kPa) is possible, a device for reducing pressure such as a pump and the like is not necessary, and production cost can be reduced as a preferable result.

The invention is the production method of a red light emitting semiconductor device described above, wherein the growth speed of the above-described active layer in the above-described the organometallic vapor phase epitaxy method is 0.1 to 4 μm/h.

It has been found that when the growth speed of the active layer is controlled to 0.1 to 4 μm/h, a base material carrying Eu or Pr can be epitaxially grown stably. The more preferable range is 0.1 to 1 μm/h.

The invention is a production method of a red light emitting semiconductor device using GaN, InN, AlN or a mixed crystal composed of any two or more of them, wherein an active layer obtained by adding Eu or Pr to GaN, InN, AlN or a mixed crystal composed of any two or more of them so as to substitute Ga, In or Al using an organometallic vapor phase epitaxy method, under conditions of a temperature of 900 to 1100° C., a carrier gas flow rate of 10 to 40 SLM and a growth pressure of over 5 kPa and less than 105 kPa, at a site wherein light emission of a wavelength of 618 to 623 nm is possible is formed between a p-type layer and an n-type layer in a series of formation steps including formation of the p-type layer and the n-type layer.

By adding Eu or Pr under conditions of a temperature of 900 to 1100° C., a carrier gas flow rate of 10 to 40 SLM and a growth pressure of over 5 kPa and less than 105 kPa, the Eu concentration or Pr concentration can be secured sufficiently, and stable high-luminance light emission can be obtained.

The invention is the production method of a red light emitting semiconductor device described above, wherein the Eu source to be added is $Eu\{N[Si(CH_3)_3]_2\}_3$ or $Eu(C_{11}H_{19}O_2)_3$.

Examples of the Eu compound include $Eu[C_5(CH_3)_5]_2$, $Eu[C_5(CH_3)_4H]_2$, $Eu\{N[Si(CH_3)_3]_2\}$, $Eu(C_5H_7O_2)_3$, $Eu(C_{11}H_{19}O_2)_3$ and the like. Among them, $Eu\{N[Si(CH_3)_3]_2\}_3$ or $Eu(C_{11}H_{19}O_2)_3$ is preferable since its vapor pressure in a reaction apparatus is high.

It has been found that the amount of Eu to be added to an active layer is preferably $1\times10^{18}$ to $1\times10^{21}$ cm$^{-3}$. When the amount is less than $1\times10^{18}$ cm$^{-3}$, it is difficult to obtain high-luminance light emission because of low concentration, while when over $1\times10^{21}$ cm$^{-3}$, luminous efficiency lowers because Eu segregation occurs in an active layer.

The invention is a red light emitting semiconductor device using GaN, InN, AlN or a mixed crystal composed of any two or more of them, wherein an active layer sandwiched by an n-type layer and a p-type layer is carried on a substrate, and the above-described active layer is obtained by adding Eu or Pr to GaN, InN, AlN or a mixed crystal composed of any two or more of them so as to substitute Ga, In or Al using an organometallic vapor phase epitaxy method.

According to this invention, since the active layer disposed between an n-type layer and a p-type layer is obtained by adding Eu or Pr so as to substitute Ga, In or Al using an organometallic vapor phase epitaxy method, a red light emitting semiconductor device which is operable by application of low voltage and showing good luminous efficiency can be provided owing to the pn junction successfully formed.

As the substrate, sapphire is usually used, though the substrate is not limited to this. Use of, for example, Si, GaN, GaAs and the like can also be made.

The invention is a red light emitting semiconductor device using GaN, InN, AlN or a mixed crystal composed of any two or more of them, wherein an active layer sandwiched by an n-type layer and a p-type layer is carried on a substrate, and the above-described active layer is obtained by adding Eu or Pr to GaN, InN, AlN or a mixed crystal composed of any two or more of them so as to substitute Ga, In or Al using an organometallic vapor phase epitaxy method at a site wherein light emission of a wavelength of 618 to 623 nm is possible.

Since Eu or Pr is added so as to substitute Ga, In or Al at a site wherein light emission of a wavelength of 618 to 623 nm is possible, a red light emitting semiconductor device showing high-luminance light emission can be provided.

The invention is a red light emitting semiconductor device produced by using the production method of a red light emitting semiconductor device described above.

The red light emitting semiconductor device produced by using the production method as described above is operable by application of low voltage and shows high luminous efficiency. And this is a semiconductor device consuming small power and friendly to environments.

The invention is the red light emitting semiconductor device as described above, wherein a barrier layer is provided at a p-type layer side of the above-described active layer.

By providing a barrier layer, electrons implanted from an n-type layer can be stored in an active layer, and efficient light emission is made possible.

One specific example of the barrier layer is a $p^-Al_{0.1}Ga_{0.9}N$ layer. It is also preferable that this barrier layer is formed by using an organometallic vapor phase epitaxy method like other layers.

The invention is the red light emitting semiconductor device described above, wherein an n-GaN layer, a Eu-added GaN layer as the above-described active layer, a p-GaN layer and a $p^+$-GaN layer are formed sequentially, and an n-type ohmic electrode is formed on the n-GaN layer and a p-type ohmic electrode is formed on the $p^+$-GaN layer.

The invention described in the paragraph above defines a preferable specific structure of the red light emitting semiconductor device according to the present invention.

The invention is the red light emitting semiconductor device described above, wherein an n-GaN layer, a Eu-added GaN layer as the above-described active layer, a $p^-Al_xGa_{(1-x)}N$ layer (wherein, $0<x\leq0.5$), a p-GaN layer and a $p^+$-GaN layer are formed sequentially, and an n-type ohmic electrode is formed on the n-GaN layer and a p-type ohmic electrode is formed on the $p^+$-GaN layer.

The invention described in the previous paragraph defines a particularly preferable specific structure of the red light emitting semiconductor device according to the present invention.

In the $p^-Al_xGa_{(1-x)}N$ layer as the barrier layer, x is regulated to $0<x\leq0.5$ since when it is over 0.5, lattice mismatch with the ground GaN layer increases, and cracking tends to occur in the $p^-Al_xGa_{(1-x)}N$ layer. x is regulated preferably to $0.01\leq x\leq0.3$, particularly preferably 0.1.

The present invention has been explained above, and in the range of the knowledge of the present inventors, a red light emitting semiconductor device which is operable by application of low voltage and showing high luminous efficiency as in the present invention has not been known yet.

That is, in the case of Patent Documents 1, 2, 4, 5 luminous efficiency and emission intensity are not sufficient since it is an indirect light emission mechanism showing red light emission by excitation of a fluorescent substance layer by blue light emission, as described above. In the case of Patent Document 3 and Non-patent Documents 1-5, the crystal quality of the resultant semiconductor has a problem, further, high voltage of tens to hundreds of V is necessary for light emission.

Non-patent documents 4, 5 describe addition of Eu to GaN at 1025° C. (growth pressure 5 kPa) and 1030° C. (growth pressure 106 kPa) using an organometallic vapor phase epitaxy method, however, it is only a literature in which red light emission of Eu-added GaN by irradiation with ultraviolet is experimentally confirmed, and it does not consider light emission in a red light emitting semiconductor device and does not consider operation at low voltage. Further, the technology is different from the present invention in the light emission mechanism, addition method of Eu, continuity in formation and the like, and does not reach the practical level as a red light emitting semiconductor device which is operable by application of low voltage and showing high luminous efficiency and emission intensity.

In red light emission shown in Non-patent Documents 4, 5, transition between $^5D_1$-$^7F_4$ (peak of different site) is observed strongly around 633 nm, and red light emission in which peaks around 621 nm (618 to 623 nm) are dominant as in the present invention is not found, and luminous efficiency is not sufficient.

Effect of the Invention

According to the present invention, a red light emitting semiconductor device which is operated at low voltage, having sufficient luminous efficiency and showing longer life can be fabricated. The resultant red light emitting semiconductor device is a device friendly to global environments.

EMBODIMENTS FOR CARRYING OUT THE INVENTION

The present invention will be illustrated based on embodiments below. The present invention is not limited to the following embodiments. The following embodiments can be variously changed in the range which is the same as and equivalent to the present invention.

[1] Growth Condition of Eu-added GaN Layer

The present inventors have carried out the following experiments regarding preferable growth conditions of an Eu-added GaN layer in a red light emitting semiconductor device according to the present invention.

1. First Experiment

Figure 1:
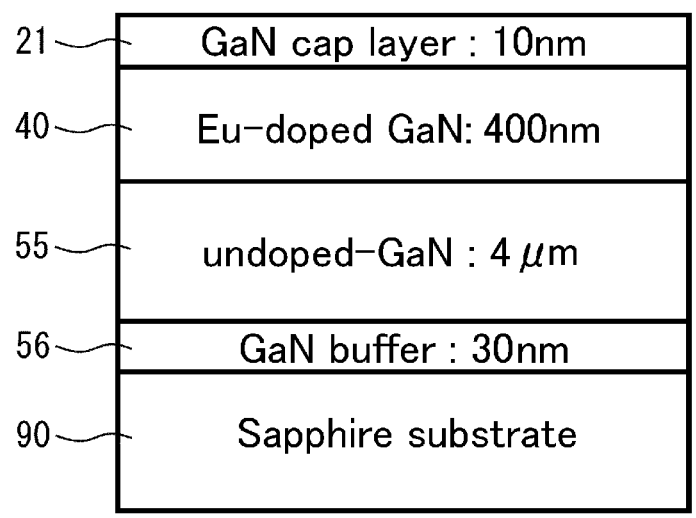
FIG. 1 is a view showing a basic structure of the red light emitting semiconductor device according to the first to third embodiments.

This experiment was conducted to check the influence of the growth temperature exerted on light emission and to clarify a light emission mechanism FIG. 1 shows a basic structure of the red light emitting semiconductor device in this experiment. In FIG. 1, 21 represents a GaN cap layer (thickness: 10 nm), 40 represents an Eu-doped GaN layer (thickness: 400 nm), 55 represents an undoped GaN layer (thickness: 4 μm), 56 represents a GaN buffer layer (thickness: 30 nm) and 90 represents a sapphire substrate.

Five kinds of red light emitting semiconductor devices having the above-described structure were fabricated using an organometallic vapor phase epitaxy method (OMVPE method) under a condition of reduced pressure (10 kPa), while changing the growth temperature of Eu-added GaN to 900° C., 950° C., 1000° C., 1050° C. and 1100° C., respectively. In this experiment, the growth speed was controlled to 0.8 μm/h and the carrier gas flow rate was controlled to 12.5 SLM.

Figure 2:
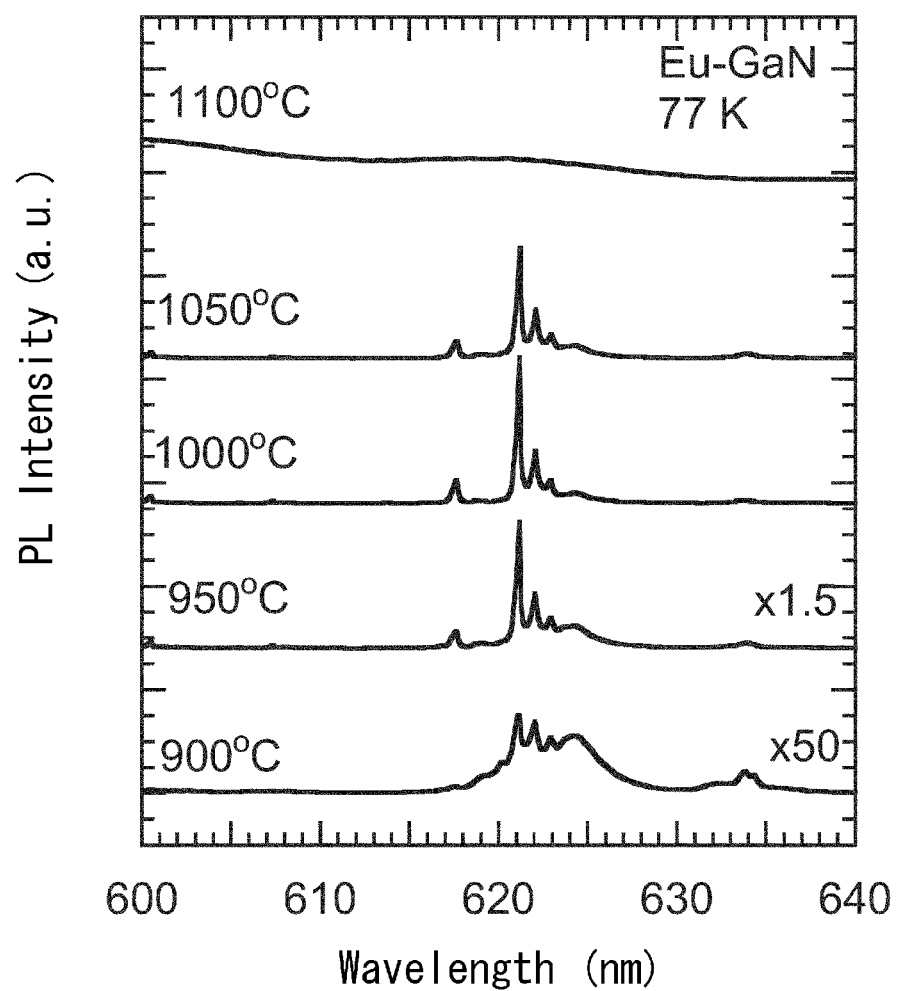
FIG. 2 is a view showing the photoluminescence spectrum of the red light emitting semiconductor device according to the first embodiment.

The photoluminescence spectra (PL spectrum) of the resultant red light emitting semiconductor devices are shown in FIG. 2 (measurement temperature: 77K). In FIG. 2, the abscissa axis represents the wavelength (nm) and the ordinate axis represents PL spectrum intensity (a.u.). In this figure, "×1.5" indicates enlargement of 1.5-fold of the actual value and, likewise, "×50" indicates enlargement of 50-fold of the actual value.

In FIG. 2, a peak observed around 621 m shows light emission ascribable to Eu ions, and as described above, it is important to increase the peak intensity observed around 621 nm as much as possible, in the present invention.

As shown in FIG. 2, at 1100° C., peaks do not appear and light emission is not observed. At 950° C. or lower, the peak intensity lowers drastically, and at 900° C., drastic lowering of the emission intensity is understood since the peaks can be confirmed only by enlargement of 50-fold.

Figure 3:
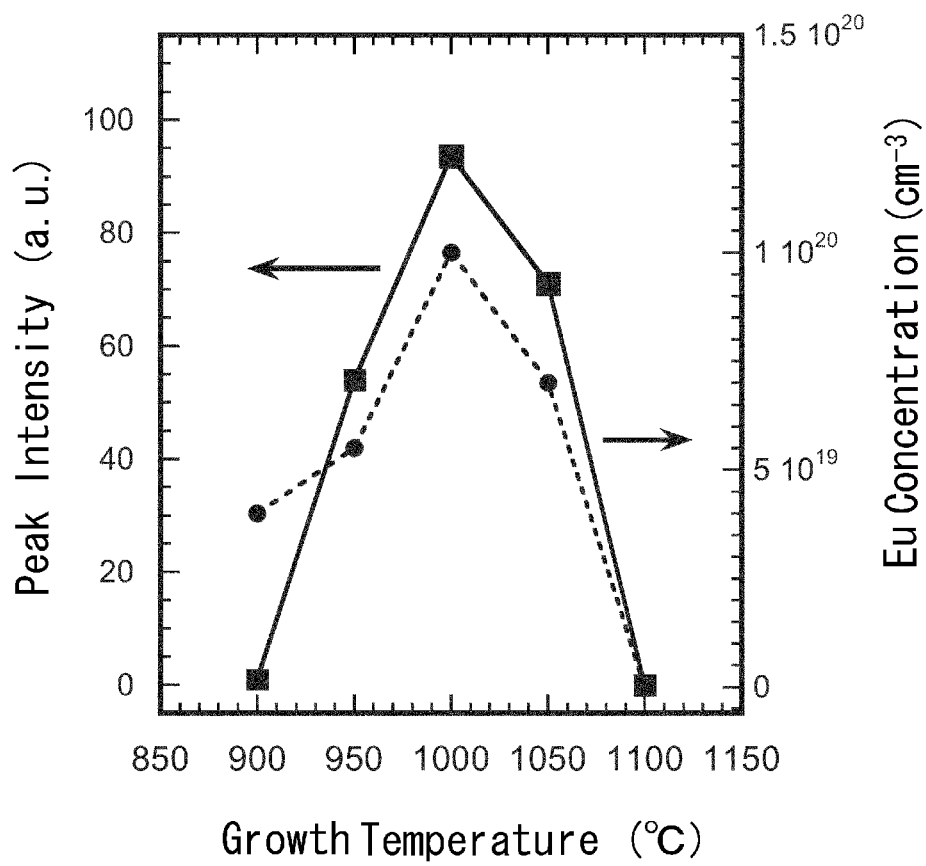
FIG. 3 is a view showing a relation between the Eu concentration and the peak emission intensity and the growth temperature of the red light emitting semiconductor device according to the first embodiment.

Such dependency of the peak intensity on temperature can be explained by the dependency of the Eu concentration on the growth temperature. FIG. 3 shows a relation between the Eu concentration identified by Secondary Ion Mass Spectrometry, the PL peak intensity (emission intensity) at 621 nm and the growth temperature. In FIG. 3, the abscissa axis represents the growth temperature (° C.), the left ordinate axis represents the PL peak intensity (a.u.) at a wavelength of 621 nm, and the right ordinate axis represents the Eu concentration ($cm^{-3}$). The solid line (■) represents the PL peak intensity and the dashed line (●) represents the Eu concentration.

As shown in FIG. 3, both the PL peak intensity and the Eu concentration are observed at 900 to 1100° C. and are maximum at 1000° C. It is believed that when the growth temperature is over 1000° C., Eu is desorbed from the growth surface thereby decreasing the Eu concentration in a membrane to lower the PL peak intensity, while when the growth temperature is lower than 1000° C., decomposition of organic raw materials and the like become insufficient thereby decreasing the Eu concentration in a membrane to lower the PL peak intensity. As shown in FIG. 3, the degree of lowering of the PL peak intensity is larger than the degree of decrease in the Eu concentration.

Such significant lowering of the PL peak intensity at the lower temperature side, namely, remarkable lowering of the emission intensity can be explained by the site selective excitation spectrum. The site selective excitation spectrum is a method in which an emission spectrum is measured while changing the excitation wavelength, paying attention to a difference in the excitation wavelength depending on the Eu substitution site. By this, what site gives an influence on the light emission wavelength can be found.

Figure 4:
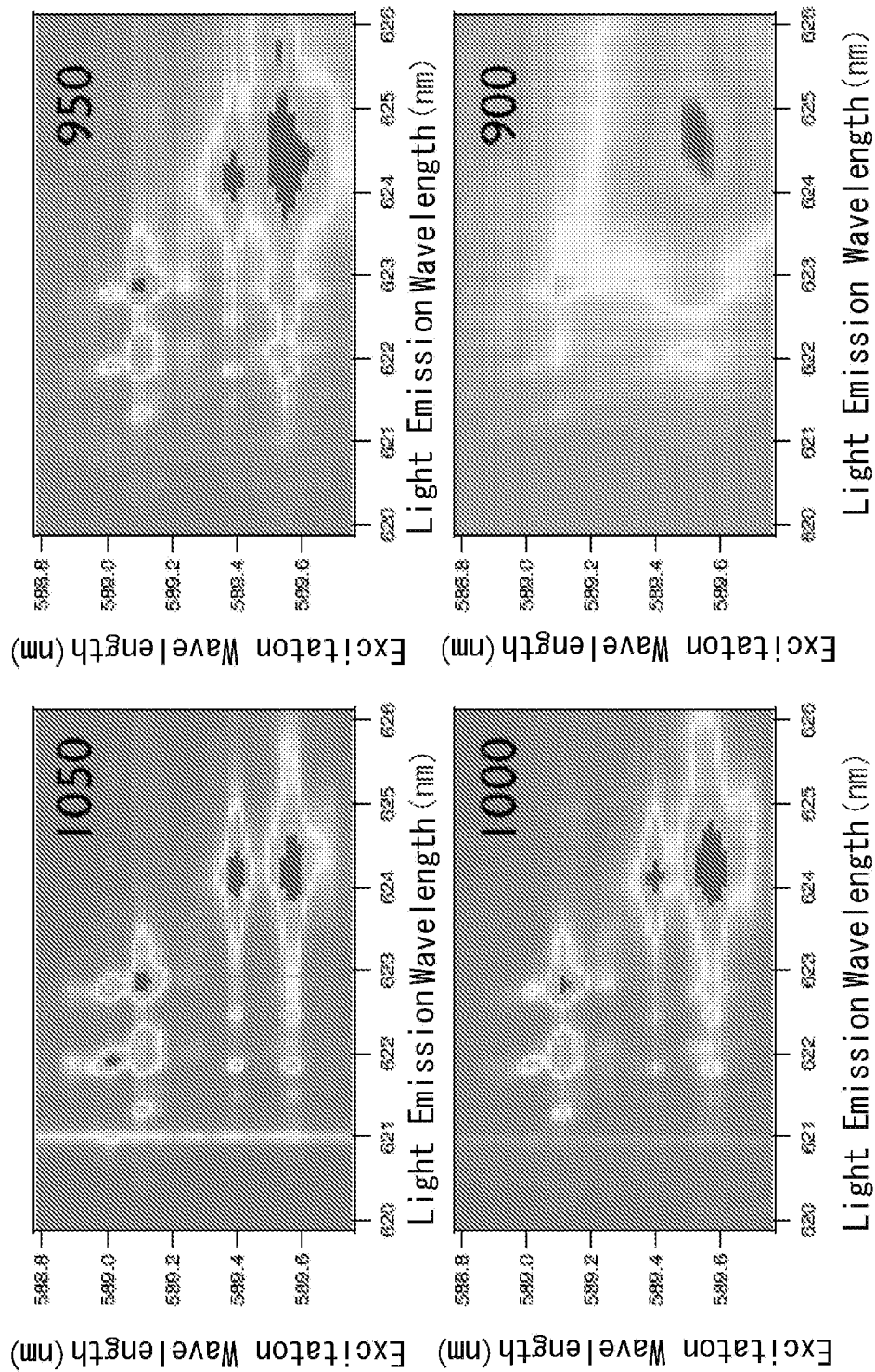
FIG. 4 is a view showing the measurement results of the site selective excitation spectrum at each growth temperature.

FIG. 4 shows site-selective excitation emission spectra at temperatures of 900° C., 950° C., 1000° C. and 1050° C. FIG. 4 teaches that when the growth temperature becomes lower, the light emission peaks around 621 nm (618 to 623 nm) decrease, and peaks around 624 nm become dominant. The presence of peaks around 624 nm is shown also in the PL spectrum of FIG. 2, however, the measurement results of the site-selective excitation emission spectra shown in FIG. 4 are teaching that, at lower temperature, light emission of different substitution site (light emission by peak around 624 nm) becomes dominant, causing remarkable lowering of the emission intensity.

Figure 5:
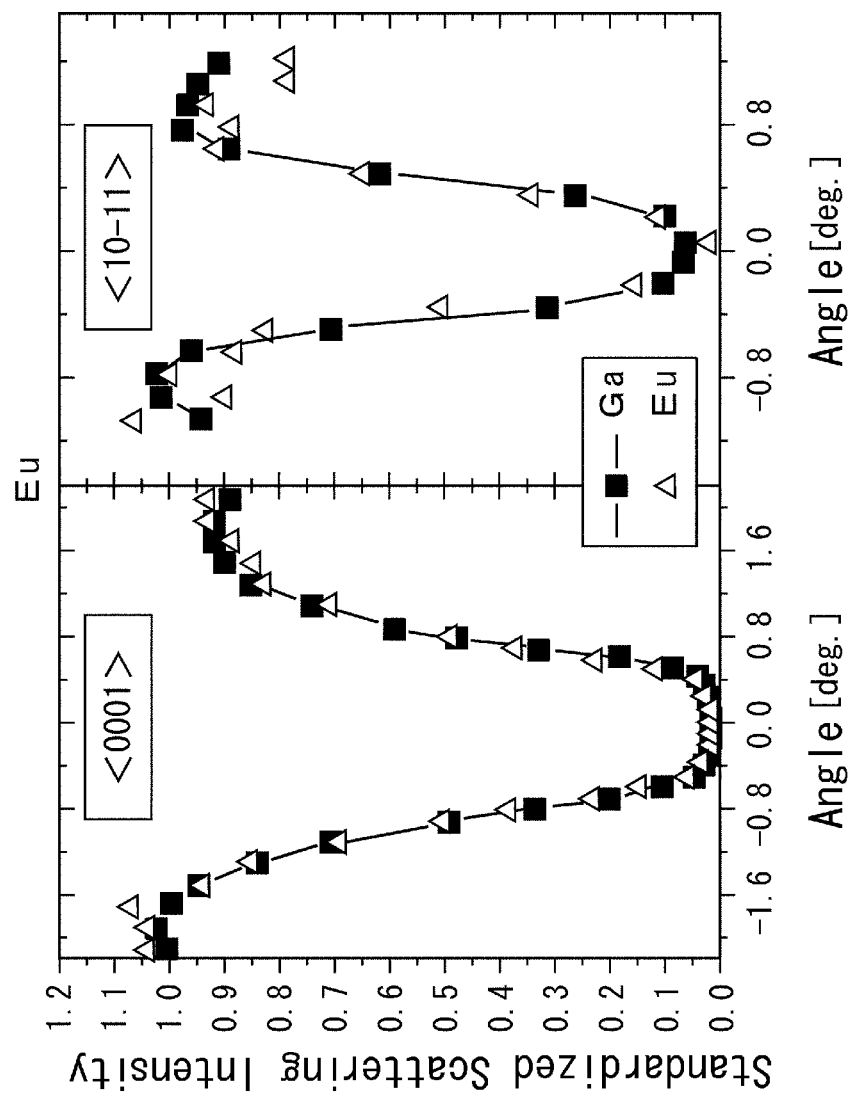
FIG. 5 is a view showing the measurement results of Rutherford Backscattering against the Eu-doped GaN layer.

The measurement results of Rutherford Backscattering of this red light emitting semiconductor device are shown in FIG. 5. In FIG. 5, (1) shows measurement results at <0001> and (2) shows measurement results at <10-11>, and the abscissa axis represents a channeling angle and the ordinate axis represents standardized scattering intensity. ■ represents measurement results at Ga and Δ represents measurement results at Eu.

As apparent from FIG. 5, curves drawn by the measurement results of Ga and Eu are well in harmony, and the substitution site of Eu ions at a growth temperature of 1050° C. is at a Ga site or its extremely near position.

It is understood from the present experiment described above that a growth temperature of 900 to 1100° C. is necessary for precisely regulating a high-luminance emission site by substituting Eu ions for Ga, in growth of Eu-added GaN using an organometallic vapor phase epitaxy method (OMVPE method).

2. Second Experiment

This experiment is an experiment paying attention to atmospheric pressure.

If GaN can be grown under atmospheric pressure, an apparatus for pressure reduction such as a vacuum pump and the like is unnecessary, leading to cost down. Thus, a red light emitting semiconductor device having a structure shown in FIG. 1 was fabricated under atmospheric pressure (100 kPa).

Figure 6:
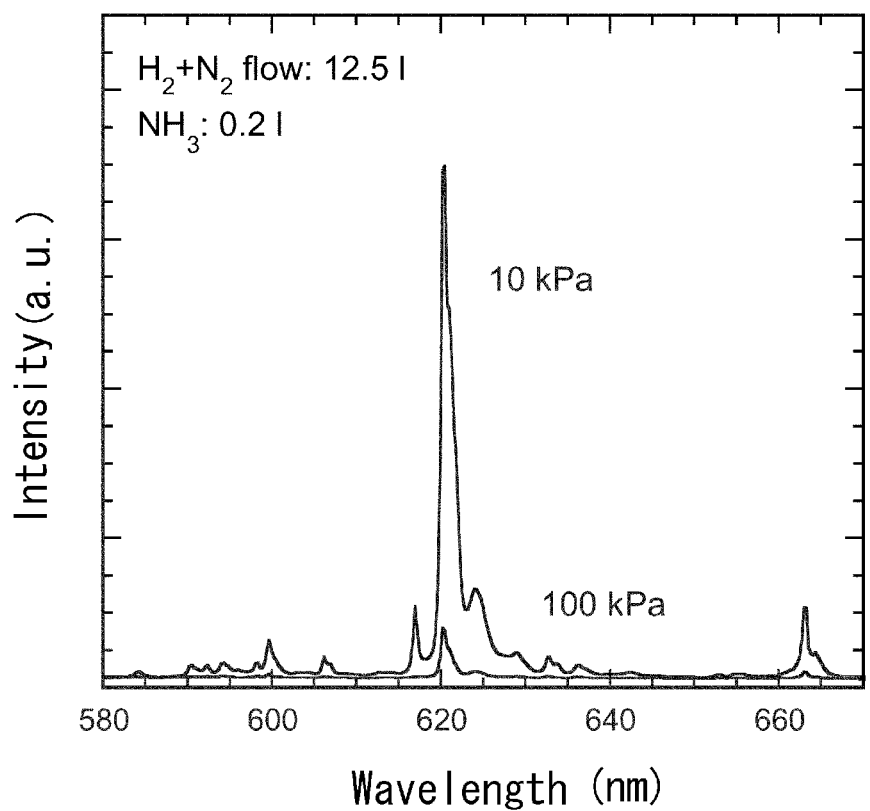
FIG. 6 is a view showing the relation between the growth pressure and the photoluminescence spectrum.

The PL spectrum of the resultant red light emitting semiconductor device is shown in FIG. 6 (measurement temperature: room temperature). In FIG. 6, the abscissa axis represents the wavelength (nm) and the ordinate axis represents the PL spectrum intensity (a.u.). The flow rates of $H_2$ and $N_2$ are 12.5 SLM and the flow rate of $NH_3$ is 0.2 SLM. In FIG. 6, the PL spectrum of a red light emitting semiconductor device fabricated under reduced pressure (10 kPa) is shown together.

As shown in FIG. 6, one fabricated under atmospheric pressure shows lowering of the emission intensity as compared with one fabricated under reduced pressure. It is believed that even if the flow rates of raw material gases are identical, the flow velocity passing through the surface of a substrate lowers in inversely proportion to pressure, thus, the amount of Eu to be added decreases, and owing to increase in pressure, the saturated vapor pressure of the Eu organic raw material lowers.

Because of this reason, for realizing high-luminance light emission in growth under atmospheric pressure, it is necessary to increase the flow velocity and it is necessary to increase the flow rate of a carrier gas. In this experiment, the total flow rate was changed from 12.5 SLM to 40 SLM, as compared with growth under reduced pressure, and a red light emitting semiconductor device was fabricated.

Figure 7:
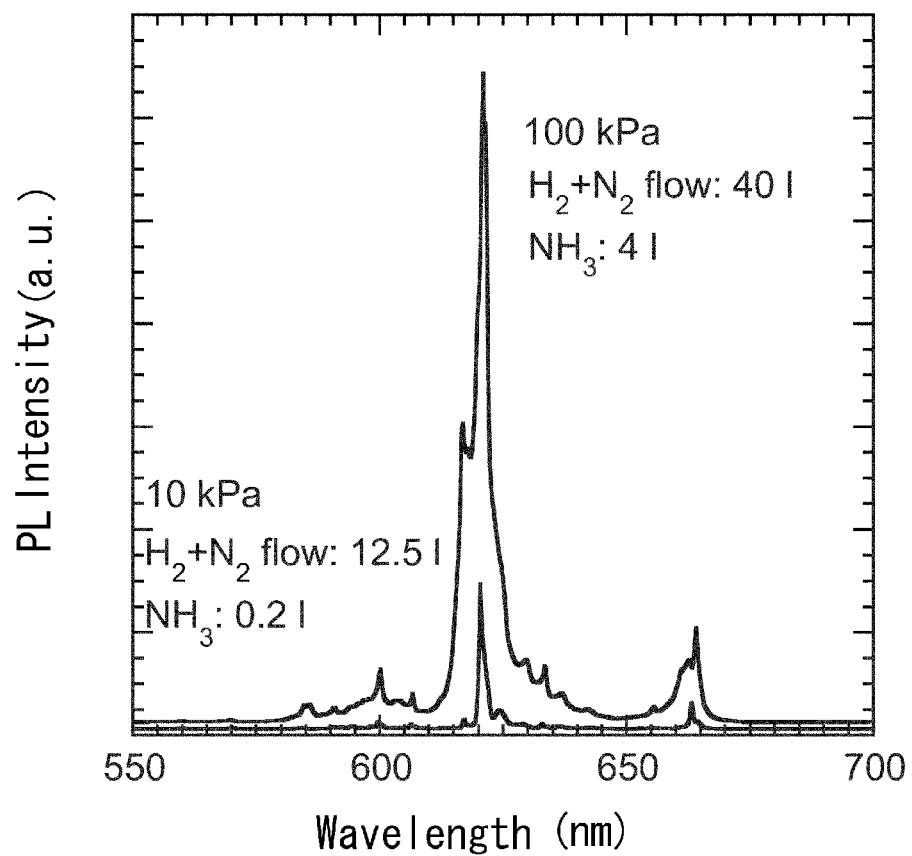
FIG. 7 is a view showing the photoluminescence spectrum of a red light emitting semiconductor device obtained by changing the gas atmosphere under atmospheric pressure.
Figure 8:
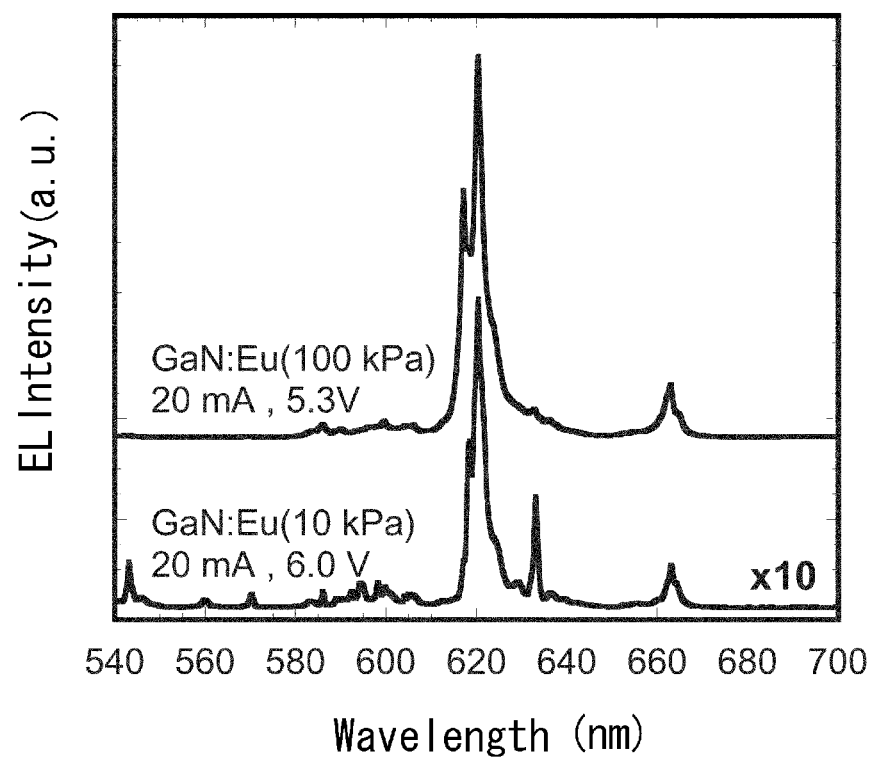
FIG. 8 is a view showing the electroluminescence spectrum of a red light emitting semiconductor device obtained by changing the gas atmosphere under atmospheric pressure.

The PL spectrum of the resultant red light emitting semiconductor device is shown in FIG. 7 together with the red light emitting semiconductor device fabricated under reduced pressure (measurement temperature: room temperature). FIG. 8 shows the electroluminescence spectrum thereof (EL spectrum). In FIG. 7, the abscissa axis represents the wavelength (nm) and the ordinate axis represents the PL intensity (a.u.). In FIG. 8, the abscissa axis represents the wavelength (nm), the ordinate axis represents the EL intensity (a.u.), and the meaning of "×10" is the same as in the case of FIG. 2.

As shown in FIG. 7, it is understood that under conditions of 100 kPa, $H_2+N_2$: 40SLM and $NH_3$: 4SLM, the light emission peak at 621 nm becomes broad, however, the emission intensity increases by about 5-fold as compared with the case under reduced pressure (10 kPa, $H_2+N_2$: 12.5 SLM, $NH_3$: 0.2 SLMl). It is understood from FIG. 8 that the EL emission intensity increases by about 10-fold as compared with the case under reduced pressure.

Thus, the growth pressure and the flow velocity are not independent variables for fabricating an excellent red light emitting semiconductor device, and it is preferable to optimize them simultaneously.

Further, it is understood that high-luminance light emission with Eu can be obtained even by growth under atmospheric pressure, by optimizing the raw material feeding amount, the flow velocity and the like.

Figure 9:
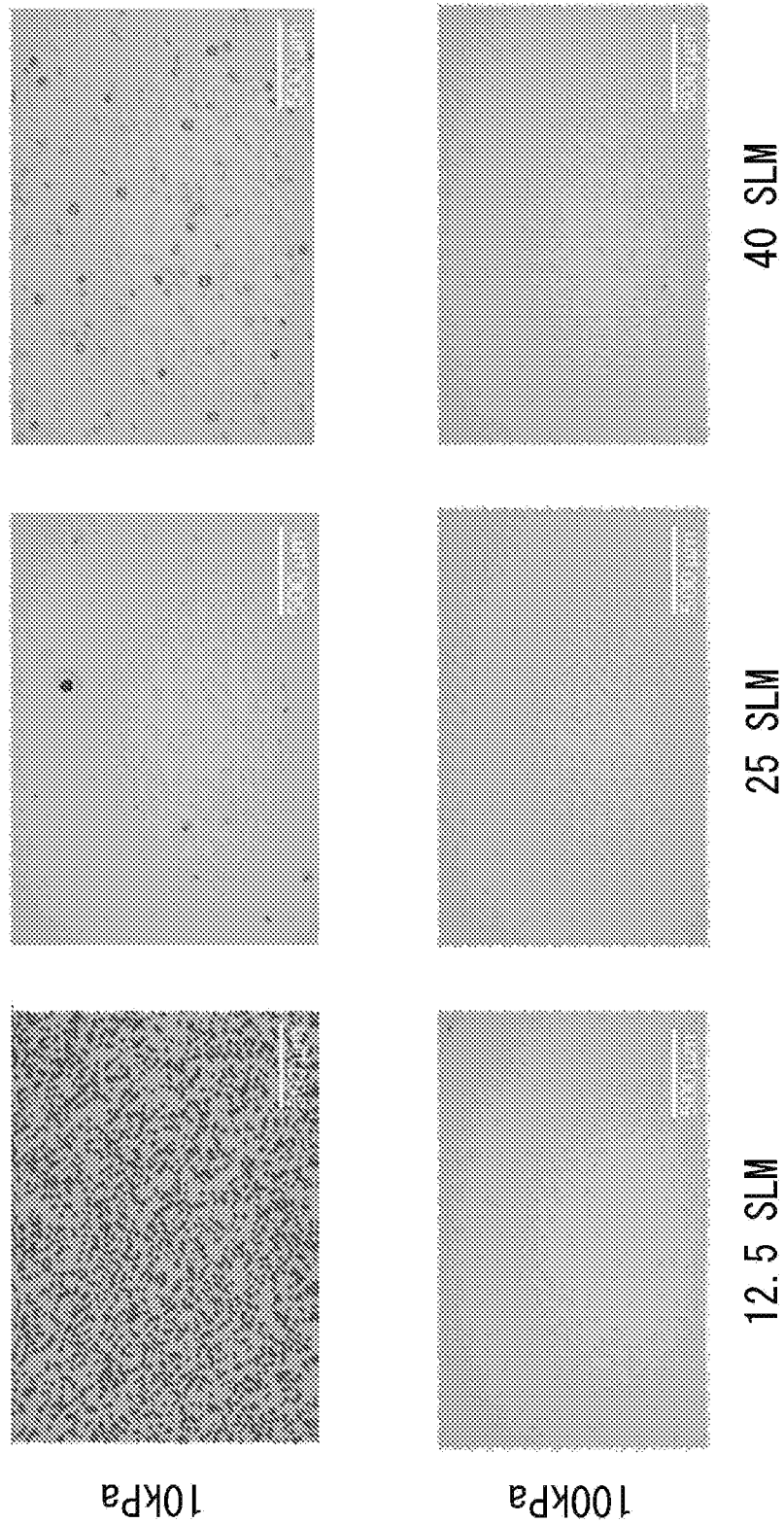
FIG. 9 shows optical micrographs of the surface of a crystal when the growth pressure and the flow rate are changed.

FIG. 9 shows optical micrographs of the surface of a crystal in which the growth pressure and the flow rate are changed. In FIG. 9, the upper stage shows the case of manufacturing under a growth pressure of 10 kPa, and the lower stage shows the case of manufacturing under a growth pressure of 100 kPa. The flow rates are 12.5 SLM, 25 SLM and 40 SLM in this order from the left side.

It is understood from FIG. 9 that in the case of a growth pressure of 10 kPa, surface flatness is lost by decrease in the flow amount, that is, the flow velocity. In contrast, in the case of a growth pressure of 100 kPa, surface flatness is not lost.

According to other experiments of the present inventors, it has been found that when the pressure in growing is 5 kPa or less, crystal surface flatness is lost, while when 105 kPa or more, it is difficult to keep the flow velocity constant in crystal growth. If the flatness of the surface of a crystal is lost, an excellent interface cannot be formed in fabricating a pn junction diode structure, thus, the device performance is lost. For this reason, the growth pressure is preferably over 5 kPa and less than 105 kPa.

[2] EXAMPLES

The present invention will be illustrated more specifically by the following example. In this example, a GaN layer was formed under conditions of a reduced pressure (10 kPa), a growth temperature of 1050° C., a growth speed of 0.8 μm/h and a flow velocity of 12.5 SLM.

1. Constitution of Red Light Emitting Semiconductor Device

Figure 10:
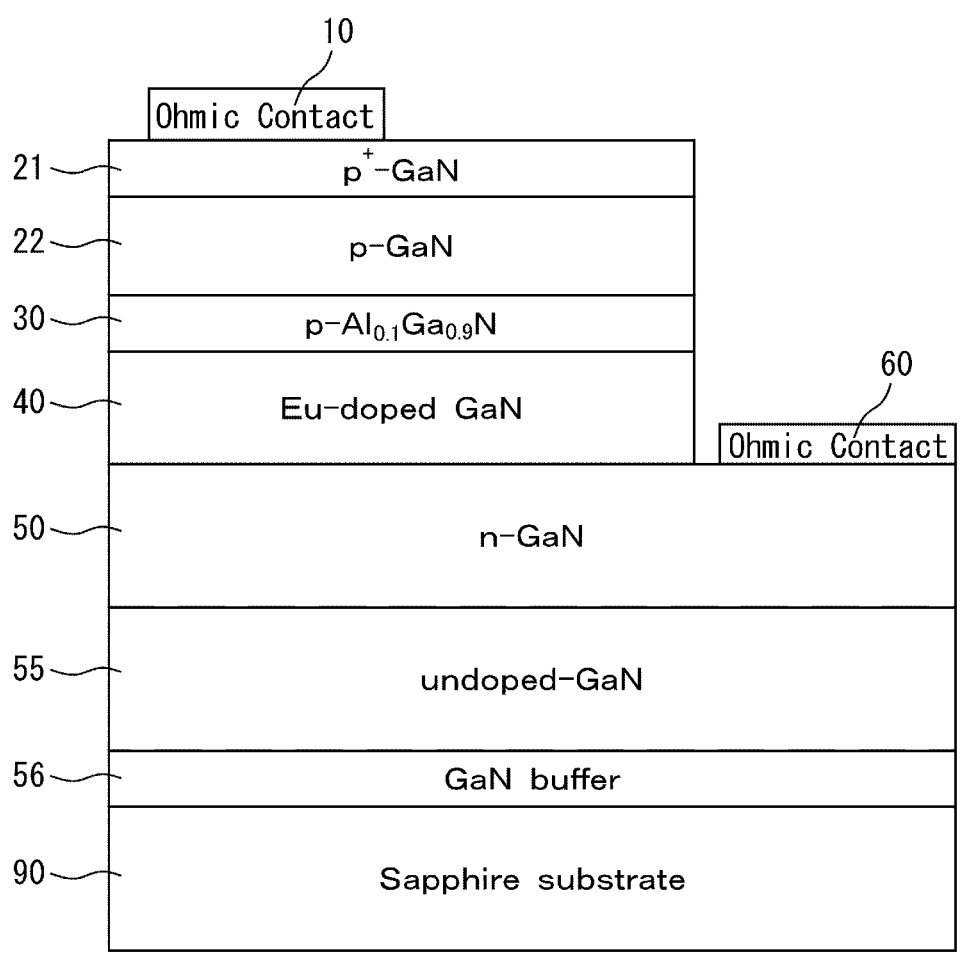
FIG. 10 is a view showing the constitution of the red light emitting semiconductor device in the example of the present invention.

First, the constitution of the red light emitting semiconductor device of this example will be illustrated. FIG. 10 is a view showing the constitution of the red light emitting semiconductor device according to the embodiment of this example. In FIG. 10, 10 represents a p-type ohmic electrode (anode), 21 represents a $p^+$-GaN layer, 22 represents a p-GaN layer and 30 represents a $p^-Al_{0.1}Ga_{0.9}N$ layer. 40 represents a Eu-doped GaN layer. Further, 50 represents an n-GaN layer, 55 represents an undoped GaN layer, 56 represents a GaN buffer layer, 60 represents an n-type ohmic electrode (cathode) and 90 represents a sapphire substrate.

A pn junction diode structure is constituted by the n-GaN layer 50, the Eu-doped GaN layer 40, the $p^-Al_{0.1}Ga_{0.9}N$ layer 30, the p-GaN layer 22 and the $p^+$-GaN layer 21.

2. Fabrication of Red Light Emitting Semiconductor Device
(1) Fabrication Method of Layers Next, outlines of the fabrication method of layers in the red light emitting semiconductor device shown in FIG. 10 will be illustrated. Fabrication of layers was carried out in a series of processes without removing the sample from the reaction tube halfway so that growth is not interrupted.

(a) Fabrication of GaN Buffer Layer

First, a GaN buffer layer 56 having a thickness of 30 nm was fabricated on a sapphire substrate 90 using an organometallic vapor phase epitaxy (OMVPE) method. This GaN buffer layer 56 is provided to prevent generation of crack due to a difference in lattice constant between sapphire and GaN.

(b) Fabrication of Undoped GaN Layer

Next, an undoped GaN layer 55 having a thickness of 3.4 μm was fabricated on the GaN buffer layer 56, likewise using an organometallic vapor phase epitaxy method. This undoped GaN layer 55 is provided to increase the distance between the sapphire substrate and the n-GaN layer, thereby suppressing the influence of dislocation.

(c) Fabrication of n-GaN Layer

Next, an n-GaN layer 50 having a thickness of 3 μm was fabricated on the undoped GaN layer 55, likewise using an organometallic vapor phase epitaxy method. This n-GaN layer 50 is provided to give a pn junction diode structure.

(d) Fabrication of Eu-doped GaN Layer 40

Next, a Eu-doped GaN layer 40 having a thickness of 300 nm was fabricated on the n-GaN layer 50, likewise using an organometallic vapor phase epitaxy method. This Eu-doped GaN layer 40 is the active layer of the red light emitting semiconductor device according to the embodiment of this example.

(e) Fabrication of $p^{31}$ $Al_{0.1}Ga_{0.9}N$ layer

Next, a $p^-Al_{0.1}Ga_{0.9}N$ layer 30 having a thickness of 10 nm was fabricated on the Eu-doped GaN layer 40, likewise using an organometallic vapor phase epitaxy method. This $p^{31}$ $Al_{0.1}Ga_{0.9}N$ layer 30 is provided as a barrier layer for allowing electrons implanted from the n-GaN layer 50 to be stored in the Eu-doped GaN layer 40 as the active layer.

(f) Fabrication of p-GaN Layer

Next, a p-GaN layer 22 having a thickness of 100 nm was fabricated on the $p^-Al_{0.1}Ga_{0.9}N$ layer 30, likewise using an organometallic vapor phase epitaxy method. This p-GaN layer 22 is provided to give a pn junction diode structure.

(g) Fabrication of $p^+$-GaN Layer

Finally, a $p^+$-GaN layer 21 having a thickness of 10 nm was fabricated on the p-GaN layer 22, likewise using an organometallic vapor phase epitaxy method. This $p^+$-GaN layer 21 is provided for efficient implantation of holes from the ohmic electrode 10.

(h) Formation of Ohmic Electrode

After completion of fabrication of the above-described layers, an ohmic electrode composed of Al/Au was formed by electron beam vapor deposition on the n-GaN layer 50 exposed by a dry etching method, as the n-type ohmic electrode 60. Likewise, a semi-transparent ohmic electrode composed of Pd/Au was formed by electron beam vapor deposition on the p-GaN layer 21. The ohmic electrodes were used since their contact interfaces with semiconductors show low electric resistance.

(2) Raw Materials and Conditions

Next, raw materials used in fabricating the red light emitting semiconductor device of this example and conditions in the fabrication will be described.

(a) N-type and P-type Impurities

As n-type and p-type impurities, Si and Mg were used. In this embodiment, the Si impurity doped concentration in the n-GaN layer 50 was $5 \times 10^{18}$ cm$^{-3}$, the Mg impurity concentrations in the p$^{31}$Al$_{0.1}$Ga$_{0.9}$N layer 30 and the p-GaN layer 22 were $5 \times 10^{17}$ cm$^{-3}$, and the Mg impurity concentration in the p$^{+}$-GaN layer 21 was $1 \times 10^{18}$ cm$^{-3}$.

(b) Eu Raw Material

Eu(C$_{11}$H$_{19}$O$_2$)$_3$ was used as the Eu organic raw material. Piping valves and the like of an organometallic vapor phase epitaxy apparatus were changed from those of usual specification (heat resistant temperature 80 to 100° C.) to those of high temperature special specification, thereby enabling the cylinder temperature to be kept at 135° C. and enabling feeding of sufficient amount of Eu to a reaction tube. The Eu concentration of the Eu-doped GaN layer 40 identified by secondary ion mass spectrometry was $7 \times 10^{19}$ cm$^{-1}$.

(c) Raw Material Gas

As the raw material gas other than Eu, trimethylgallium was used for Ga, ammonia was used for N, trimethylaluminum was used for Al, cyclopentadienylmagnesium was used for Mg, and monomethylsilane was used for Si.

(d) Carrier Gas

As the carrier gas, hydrogen was used.

(e) Temperature, Atmosphere Pressure

The temperature in the reaction tube in forming a GaN layer (growth temperature) was adjusted to 1050° C. among 900 to 1100° C. in the above-described first experiment. The atmosphere pressure (growth pressure) was adjusted to 10 kPa among 5 kPa to 105 kPa in the above-described third experiment.

(f) Reaction Vessel and the Like

The flow passage cross-sectional area of the used reaction vessel was 10 cm$^2$, and the size of a substrate was 2 inches. Further, uniform addition of Eu (substitution mode invasion) was attained by suppressing generation of convection by optimizing the flow velocity of the gas to be introduced.

(g) Growth Speed

Under the constitution as described above, an active layer was formed at a growth speed of 0.8 μm/h.

3. Light Emission Test

Figure 11:
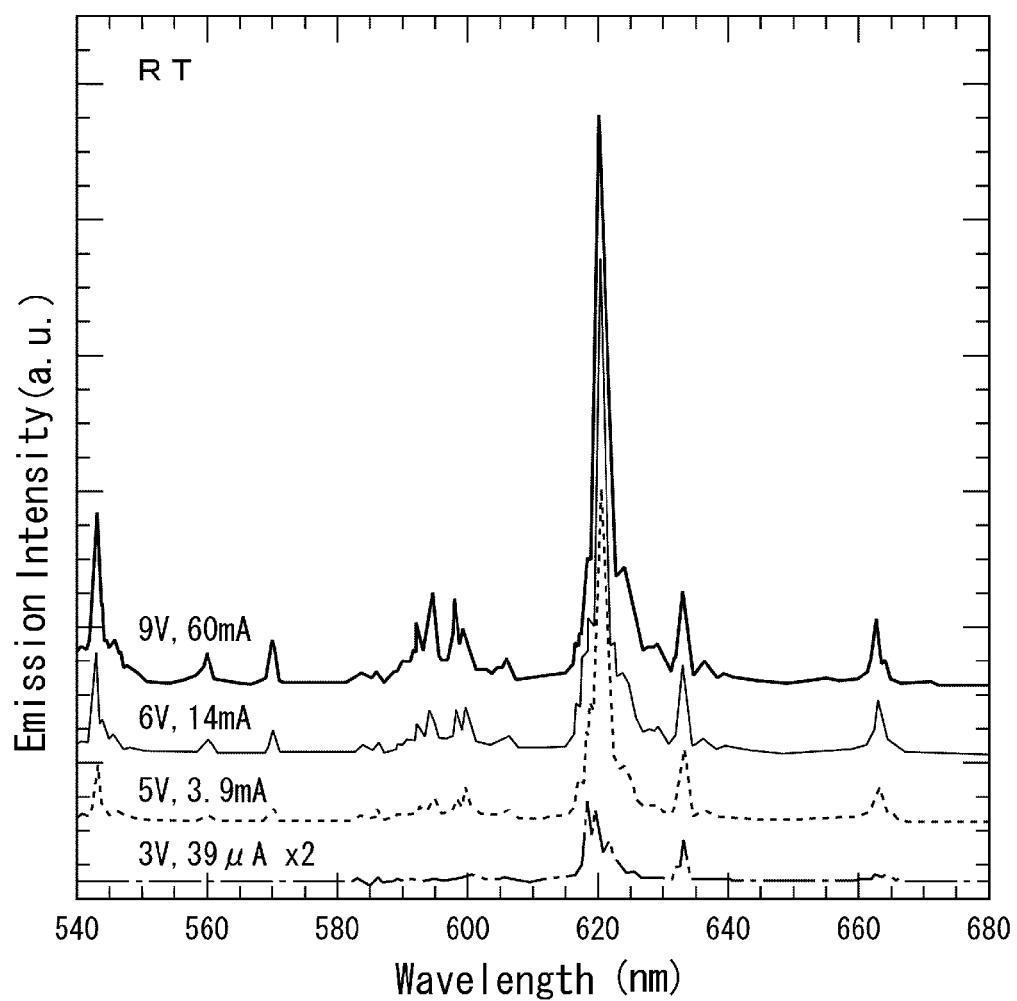
FIG. 11 is a view showing the electroluminescence of the red light emitting semiconductor device in the example of the present invention.

Next, voltages of 3, 5, 6 and 9V were applied at room temperature in the forward direction to the fabricated pn junction diode, to obtain electroluminescence spectra (EL spectra) as shown in FIG. 11. In FIG. 11, the ordinate axis represents the emission intensity (arbitrary unit, a.u.) and the abscissa axis represents the wavelength (nm). The thick line represents a case of 9V-60 mA, the solid line represents a case of 6V-14 mA, the dashed line represents a case of 5V-3.9 mA, and the dotted-dashed line represents a case of 3V-39 μA.

4. Evaluation of Test Results

A conventional red light emitting semiconductor device having a MIS structure needs high voltage for light emission since this device is operated according to a collisional excitation mechanism, while the red light emitting semiconductor device according to this embodiment is capable of performing light emission by application of low voltage since electric current is implanted in a pn junction diode structure. As shown in FIG. 11, sharp light emission ascribable to Eu ions is observed at a specific wavelength in the red region around 621 nm and it is confirmed that excitation of Eu ions via a base material was caused by implanting carriers into the GaN base, that is, selective excitation occurs to cause light emission at a site in which $^5D_0 \rightarrow {^7F_2}$ emission peaks are dominant.

According to the present invention as described above, a red light emitting semiconductor device which is operated at low voltage, showing high luminous efficiency and showing high emission intensity can be realized, by fabricating an active layer by adding Eu or Pr to a semiconductor layer using GaN, InN, AlN and the like by organometallic vapor phase epitaxy under specific conditions so as to substitute Ga, In or Al, and using a pn junction diode technology in combination.

Description of the Reference Signs

10 p-type ohmic electrode
21 p$^+$-GaN layer
22 p-GaN layer
30 p$^-$Al$_{0.1}$Ga$_{0.9}$N layer
40 Eu-doped GaN layer
50 n-GaN layer
55 undoped GaN layer
56 GaN buffer layer
60 n-type ohmic electrode
90 sapphire substrate

What is claimed is:

1. A production method of a red light emitting semiconductor device using GaN, InN, AlN or a mixed crystal composed of any two or more of them,
   wherein
   an active layer obtained by
   adding Eu or Pr to GaN, InN, AlN or a mixed crystal composed of any two or more of them so as to substitute Ga, In or Al
   in a reaction vessel without removing from the reaction vessel halfway
   using an organometallic vapor phase epitaxy method
   with an organometallic vapor phase epitaxy apparatus equipped with a piping valve of high temperature special specification having heat resistant temperature of higher than 100° C.
   under a temperature condition of 900 to 1100° C. thereby keeping the cylinder temperature of organic raw materials at high temperature
   is formed in a series of formation steps including formation of the p-type layer and the n-type layer at a growth speed of 0.1 to 4 μm/h without causing damage to the crystal surfaces, so as to produce a red light emitting semiconductor device having no interface state between the layers, and enabling carriers being implanted efficiently and operation at low voltage.

2. The production method of a red light emitting semiconductor device according to claim 1, wherein the above-described element to be added is Eu.

3. The production method of a red light emitting semiconductor device according to claim 1 or claim 2, wherein the Eu source to be added is Eu{N[Si(CH$_3$)$_3$]$_2$}$_3$ or Eu(C$_{11}$H$_{19}$O$_2$)$_3$.

4. The production method of a red light emitting semiconductor device according to claim 1 or claim 2, wherein the amount of Eu to be added is $1 \times 10^{18}$ to $1 \times 10^{21}$ cm$^{-3}$.

* * * * *